United States Patent
Yan et al.

(10) Patent No.: US 10,615,573 B2
(45) Date of Patent: Apr. 7, 2020

(54) OPTICAL MODULE

(71) Applicants: HISENSE BROADBAND MULTIMEDIA TECHNOLOGIES, LTD., Tortola (VG); HISENSE USA CORP., Suwanee, GA (US); HISENSE INTERNATIONAL CO., LTD., Qingdao, Shandong (CN)

(72) Inventors: Hongping Yan, Shandong (CN); Dengshan Xue, Shandong (CN); Qisheng Zhao, Shandong (CN); Ming Li, Shandong (CN)

(73) Assignees: HISENSE BROADBAND MULTIMEDIA TECHNOLOGIES, LTD., Tortola (VG); HISENSE USA CORP., Suwanee, GA (US); HISENSE INTERNATIONAL CO., LTD., Qingdao, Shangdong (CN)

(*) Notice: Subject to any disclaimer, the term of this patent is extended or adjusted under 35 U.S.C. 154(b) by 0 days.

(21) Appl. No.: 16/138,430

(22) Filed: Sep. 21, 2018

(65) Prior Publication Data

US 2019/0036307 A1 Jan. 31, 2019

Related U.S. Application Data

(63) Continuation of application No. 15/087,261, filed on Mar. 31, 2016, now Pat. No. 10,122,151.

(30) Foreign Application Priority Data

Jun. 30, 2015 (CN) .......................... 2015 1 0520810

(51) Int. Cl.
*H01S 5/125* (2006.01)
*H04B 10/50* (2013.01)
(Continued)

(52) U.S. Cl.
CPC ............ *H01S 5/125* (2013.01); *H01S 5/0427* (2013.01); *H01S 5/06256* (2013.01);
(Continued)

(58) Field of Classification Search
CPC .... H01S 5/125; H01S 5/0427; H01S 5/06256; H04B 10/503
See application file for complete search history.

(56) References Cited

U.S. PATENT DOCUMENTS

2012/0113999 A1* 5/2012 Tanaka ................. H01S 5/0427
372/38.02

* cited by examiner

*Primary Examiner* — Armando Rodriguez
(74) *Attorney, Agent, or Firm* — Brinks Gilson & Lione

(57) ABSTRACT

An optical module includes a laser transmitter driver chip, a Distributed Bragg reflection (DBR) raster, a laser transmitter, a first resistor, a first capacitor, a second resistor, a second capacitor and a power source. The first resistor is connected between a power source and a differential signal output positive terminal of the laser transmitter; the first capacitor is connected between the differential signal output positive terminal and the a positive terminal of the laser transmitter; the second resistor is connected between the power source and a differential signal output negative terminal of the laser transmitter driver chip; the second capacitor is connected between the differential signal output negative terminal and a negative terminal of the laser transmitter; and the negative terminal of the laser transmitter and a negative terminal of the DBR raster are grounded.

20 Claims, 4 Drawing Sheets

(51) Int. Cl.
 *H01S 5/042* (2006.01)
 *H01S 5/0625* (2006.01)
 *H04B 10/54* (2013.01)
 *H04B 10/572* (2013.01)
(52) U.S. Cl.
 CPC ......... *H04B 10/503* (2013.01); *H04B 10/504* (2013.01); *H04B 10/541* (2013.01); *H04B 10/572* (2013.01)

OPTICAL MODULE

PRIORITY STATEMENT

This application is a continuation under 35 U.S.C. § 120 of U.S. application Ser. No. 15/087,261 filed on Mar. 31, 2016, pending, which claims the priority benefit of Chinese Patent Application No. 201510520810.4 filed on Jun. 30, 2015, in the State Intellectual Property Office of the People's Republic of China, the disclosure of which is incorporated herein in its entirety by reference.

TECHNICAL FIELD

The present disclosure relates to the technical field of optical communication, in particular to an optical module.

BACKGROUND

Along with the increase of a request of people for communication bandwidth, a Fiber-to-the-x (FTTx) technology obtains fast development, and the FTTx technology taking a Passive Optical Network (PON) technology as the principal thing is widely used.

A PON usually includes an optical circuit terminal mounted at a central control station and an Optical Network Unit (ONU) mated and mounted in each user occasion, and the ONU is provided with a modulating circuit for modulating a light emitting signal of the Distributed Feedback Laser (DFB) burst transmission circuit, and a laser transmitter driver chip for driving a laser transmitter to emit light.

SUMMARY

The present disclosure provides an optical module. The optical module may include a laser transmitter driver chip, a Distributed Bragg reflection (DBR) raster, a laser transmitter, a first resistor, a first capacitor, a second resistor, a second capacitor and a power source. The first resistor is connected between a power source and a differential signal output positive terminal of the laser transmitter; the first capacitor is connected between the differential signal output positive terminal and the a positive terminal of the laser transmitter; the second resistor is connected between the power source and a differential signal output negative terminal of the laser transmitter driver chip; the second capacitor is connected between the differential signal output negative terminal and a negative terminal of the laser transmitter; and the negative terminal of the laser transmitter and a negative terminal of the DBR raster are grounded.

BRIEF DESCRIPTION OF THE DRAWINGS

In order to illustrate embodiments of the disclosure, or technical solutions in the prior art, drawings used in description of the embodiments or the prior art are briefly described, obviously, the drawings described as follows are some embodiments of the disclosure, and those common skilled in the art may obtain other drawings according to these drawings without paying out inventive labor.

DETAILED DESCRIPTION

In order to clarify the aims, technical solutions and advantages of the embodiments of the present disclosure, the technical solutions of the embodiments will be described in a clearly and fully understandable way in combination with the drawings in the embodiments of the present. It is obvious that the described embodiments are just a part but not all of the embodiments of the disclosure. Based on the described embodiments in the present disclosure, those skilled in the art may obtain other embodiment(s), without any inventive work, which should be within the scope of the disclosure.

Figure 1:
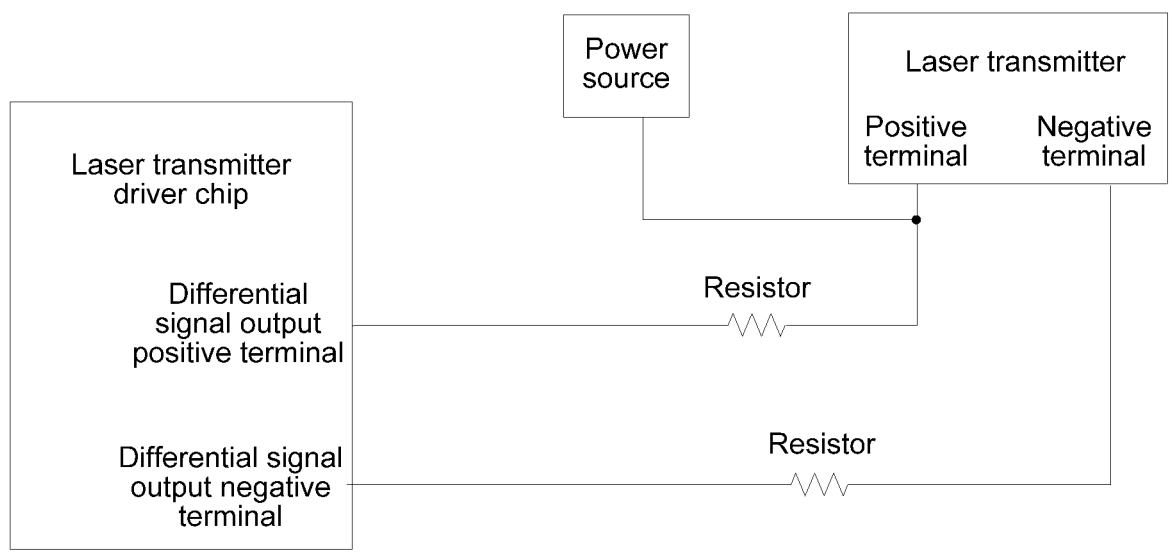
FIG. 1 is a schematic diagram of a modulating circuit in the prior art.

FIG. 1 is a schematic diagram of a modulating circuit in the prior art. As shown in FIG. 1, in PON ONU, the modulating circuit includes two resistors, when the differential signal output positive terminal of the laser transmitter driver chip is low-level, and the differential signal output negative terminal is high-level, no modulating current flows to the negative terminal of the laser transmitter from the positive terminal of the laser transmitter, the laser transmitter emits weak optical signal. When the differential signal output positive terminal of the laser transmitter driver chip is high-level, and the differential signal output negative terminal is low-level, the modulating current flows to the negative terminal of the laser transmitter from the positive terminal of the laser transmitter, and the laser transmitter emits a strong optical signal.

A Wavelength Division Multiplexing (WDM)-based PON may adopts, a laser transmitter with a Distributed Bragg Reflector (DBR). The DBR laser is a laser transmitter that emits a laser beam of which the wavelength depends on the amplitude of an input current. in order to stabilize the current flowing by a DBR raster in the DBR laser, the negative terminal of the DBR raster is grounded, and due to the limitation of a manufacturing process, when the DBR laser is manufactured, the negative terminal of the laser transmitter in the DBR laser and the negative terminal of the DBR raster are connected together and grounded, which is therefore equivalent to the short circuit between the positive terminal and the negative terminal of the laser transmitter. However, when the negative terminal of the laser transmitter in the DBR laser and the negative terminal of the DBR raster are connected together and grounded, traditional designs cannot modulate the light emitting intensity of the laser transmitter. The embodiments in the present disclosure are provided for solving the problem.

The optical module provided in the embodiments of the present disclosure is described in combination with the drawings.

Figure 2:
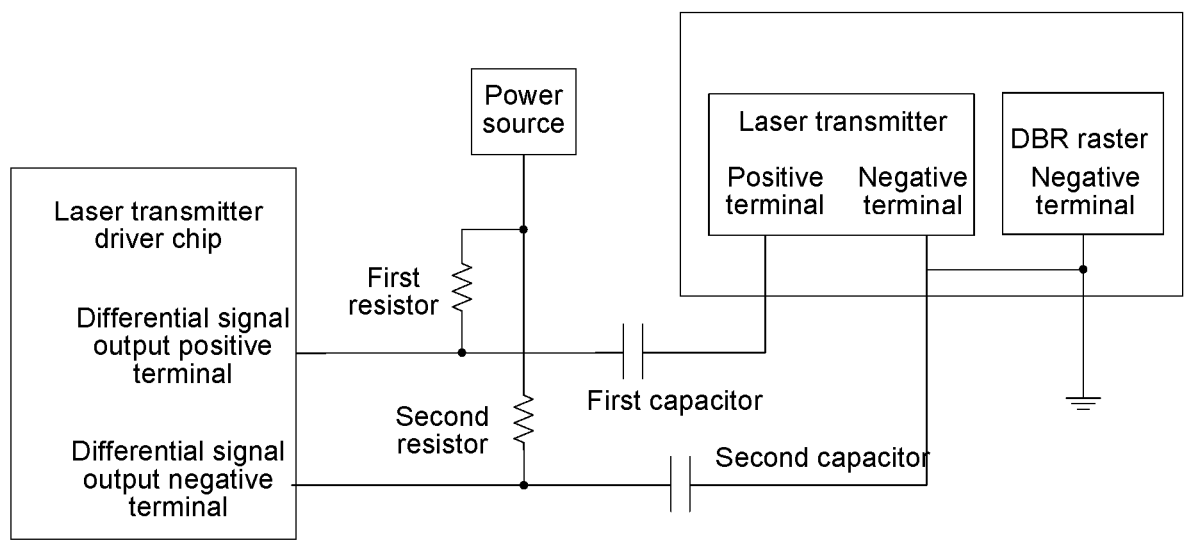
FIG. 2 is a schematic diagram of an optical module according to some embodiments of the present disclosure.

FIG. 2 is a schematic diagram of an optical module according to some embodiments of the present disclosure. As shown in FIG. 2, the optical module in the present embodiment may include: a laser transmitter driver chip, a Distributed Bragg reflection (DBR) raster, a laser transmitter, a first resistor, a first capacitor, a second resistor, a second capacitor and a power source;

The laser transmitter driver chip includes a differential signal output positive terminal and a differential signal output negative terminal; the differential signal output positive terminal and the differential signal output negative terminal are used for outputting a differential signal with high and low level change. One end of the first resistor is connected with the differential signal output positive terminal, and the other end of the first resistor is connected with the power source; one end of the first capacitor is connected with the differential signal output positive terminal and the other end of the first capacitor is connected with the positive terminal of the laser transmitter; one end of the second resistor is connected with the differential signal output negative terminal, and the other end of the second resistor is connected with the power source; one end of the second capacitor is connected with the differential signal output negative terminal and the other end of the second capacitor is connected with the negative terminal of the laser transmitter; and the negative terminal of the laser transmitter and the negative terminal of the DBR raster are grounded.

In prior art, since the negative terminal of the laser transmitter is connected with a bias pin of the laser transmitter driver chip, a modulating circuit may modulate the light emitting signal of the laser transmitter through direct current coupling: the modulating circuit in the prior art includes two resistors, the differential signal output positive terminal of the laser transmitter driver chip is connected with the positive terminal of the laser transmitter and the power source by one resistor, the differential signal output negative terminal is connected with the negative terminal of the laser transmitter by the other resistor, therefore, the high level and low level are set for the differential signal output positive terminal and the differential signal output negative terminal and are matched with the modulating circuit, and the size of the current flowing by the laser transmitter is controlled to control whether the laser transmitter emits strong or weak light (e.g., high intensity light or low intensity light).

In the present embodiment, when the DBR laser is designed, the negative terminal of the laser transmitter and the negative terminal of the DBR raster are connected together and grounded, which is caused by two reasons: 1, the negative terminal of the laser transmitter and the negative terminal of the DBR raster are connected together due to a manufacturing process; 2, after grounding, the low level of the DBR raster is stable, which may ensure a stable current flowing by the DBR raster, therefore, light of different wavelengths may be accurately selected as required by controlling the size and change of input current, and such design causes that when the laser transmitter emits light, the light emitting intensity of the laser transmitter cannot be modulated in a direct current modulating manner.

In the present embodiment, because a capacitor stores electric charge, the voltages at two ends of a capacitor cannot be suddenly changed, thus two capacitors may be connected in parallel in the circuit to realize the modulating of the light emitting signal of the laser transmitter. For example, the modulating circuit in the present disclosure includes the first resistor, the first capacitor, the second resistor and the second capacitor.

When the laser transmitter emits light, the high level and low level are set for the differential signal output positive terminal and the differential signal output negative terminal of the laser transmitter driver chip so as to control the size of the current flowing by the laser transmitter and further control whether the laser transmitter emits strong or weak light.

In an implementation, when the differential signal output positive terminal is low-level and the differential signal output negative terminal is high-level, the first capacitor is charged, the second capacitor is discharged, and the laser transmitter emits weak light; when the differential signal output positive terminal is high-level, and the differential signal output negative terminal is low-level, the first capacitor is discharged, the second capacitor is charged, and the laser transmitter emits strong light.

When the differential signal output positive terminal is low-level, one end of the first capacitor connected with the differential signal output positive terminal is low-level, because the levels at two ends of the capacitor cannot be suddenly changed, the other end of the first capacitor is also low-level, the positive terminal of the laser transmitter is high-level, therefore, the first capacitor is charged, the flowing direction of the whole modulating current flows to the first capacitor from the power source, and is input to the differential signal output positive terminal; meanwhile, the differential signal output negative terminal is high-level, then two ends of the second capacitor are also high-level, and the negative terminal of the laser transmitter is grounded and is thus low-level, then the second capacitor is discharged, the negative terminal of the laser transmitter is grounded, the modulating current is directly grounded, no module current flows by the laser transmitter and the laser transmitter emits weak light.

When the differential signal output positive terminal is high-level, one end of the first capacitor connected with the differential signal output positive terminal is high-level, because the levels at two ends of the capacitor cannot be suddenly changed, the other end of the first capacitor is also high-level, the positive terminal of the laser transmitter is low-level, therefore, the first capacitor is discharged, the modulating current flows in from positive terminal of the laser transmitter and flows out from the negative terminal of the laser transmitter, the modulating current flowing out from the negative terminal of the laser transmitter is divided into two paths, one path charges the second capacitor and the other path is grounded; meanwhile, the differential signal output negative terminal is low-level, then two ends of the second capacitor are also low-level, at the moment, the second capacitor is charged, the module current flows by the laser transmitter and the laser transmitter emits strong light.

In the present embodiment, when the modulating of the light emitting signal of the laser transmitter is realized by charging and discharging of a coupling capacitor, that is to say, in the modulating circuit, when the laser transmitter emits light, by setting the high level for the differential signal output positive terminal and the low level for the differential signal output negative terminal or setting the low level for the differential signal output positive terminal and the high level for the differential signal output negative terminal, the modulation that the light emitting signal of the laser transmitter is 1 or 0 may be realized.

The optical module provided in the present embodiment may include a laser transmitter driver chip, a Distributed Bragg reflection (DBR) raster, a laser transmitter, a first resistor, a first capacitor, a second resistor, a second capacitor and a power source, wherein the laser transmitter driver chip includes a differential signal output positive terminal and a differential signal output negative terminal; the differential signal output positive terminal and the differential signal output negative terminal are used for outputting a differential signal with high and low level change, wherein, one end of the first resistor is connected with the differential signal output positive terminal, and the other end of the first resistor is connected with the power source; one end of the first capacitor is connected with the differential signal output positive terminal and the other end of the first capacitor is connected with the positive terminal of the laser transmitter; one end of the second resistor is connected with the differential signal output negative terminal, and the other end of the second resistor is connected with the power source; one end of the second capacitor is connected with the differential signal output negative terminal and the other end of the second capacitor is connected with the negative terminal of the laser transmitter; and the negative terminal of the laser transmitter and the negative terminal of the DBR raster are grounded; when the differential signal output positive terminal of the laser transmitter driver chip of the optical module is low-level and the differential signal output negative terminal is high-level, the first capacitor is charged, the second capacitor is discharged, and the laser transmitter emits weak light; when the differential signal output positive terminal is high-level, and the differential signal output negative terminal is low-level, the first capacitor is discharged, the second capacitor is charged, and the laser transmitter emits strong light, thus realizing the modulating on the light emitting intensity of the laser transmitter.

Figure 3:
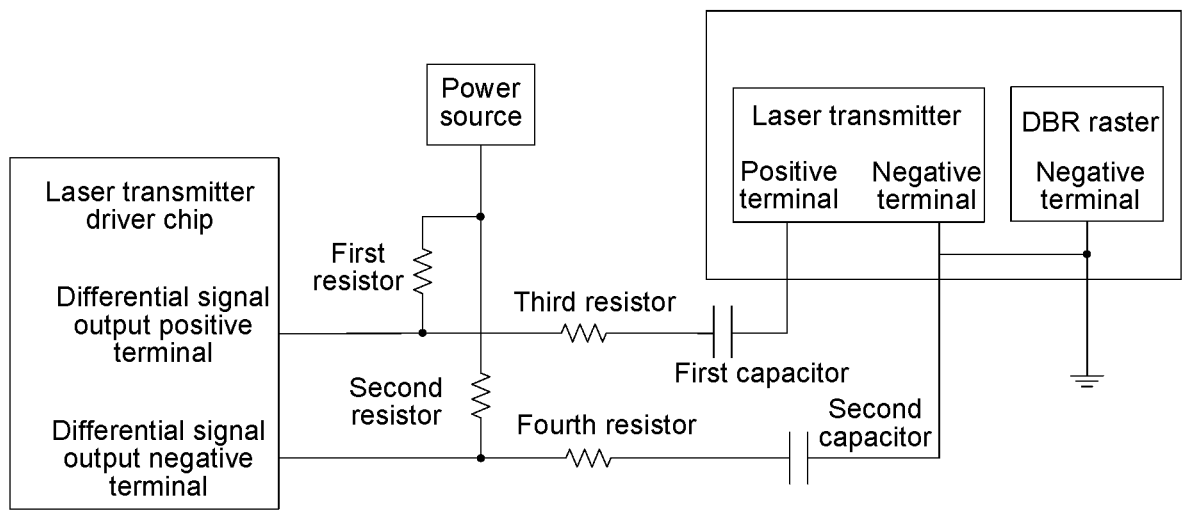
FIG. 3 is a schematic diagram of an optical module according to some embodiments of the present disclosure.

FIG. 3 is a schematic diagram of an optical module according to some embodiments of the present disclosure. As shown in FIG. 3, based on the above embodiments, in order to isolate a low frequency noise signal, the optical module provided in the present embodiment may further include a low frequency signal filter circuit. To this end, the optical module may further include a third resistor and/or a fourth resistor.

The third resistor is arranged between the first capacitor and the differential signal output positive terminal, and the fourth resistor is arranged between the second capacitor and the differential signal output negative terminal. In an implementation, resistance value ranges of the third resistor and the fourth resistor are both 0-15 ohm, which is not limited in the present embodiment.

In an implementation, the modulating circuit of the present embodiment may include a third resistor only or may include a fourth resistor only, and also may include the third resistor and the fourth resistor at the same time, which may be selected according to actual demands, in the present embodiment, the solution of arranging the third resistor and the fourth resistor at the same time is selected to isolate the low frequency noise signal, as shown in FIG. 3.

According to the optical module provided in the present embodiment, the modulating circuit includes the first resistor and the first capacitor as well as the second resistor and the second capacitor, the third resistor is arranged between the first capacitor and the differential signal output positive terminal, and/or the fourth resistor is arranged between the second capacitor and the differential signal output negative terminal, when the differential signal output positive terminal of the laser transmitter driver chip of the optical module is low-level and the differential signal output negative terminal is high-level, the first capacitor is charged, the second capacitor is discharged, and the laser transmitter emits weak light; when the differential signal output positive terminal is high-level, and the differential signal output negative terminal is low-level, the first capacitor is discharged, the second capacitor is charged, and the laser transmitter emits strong light, the modulating on the light emitting intensity of the laser transmitter is realized, and by the third resistor and/or the fourth resistor, the low frequency noise signal is isolated.

Figure 4:
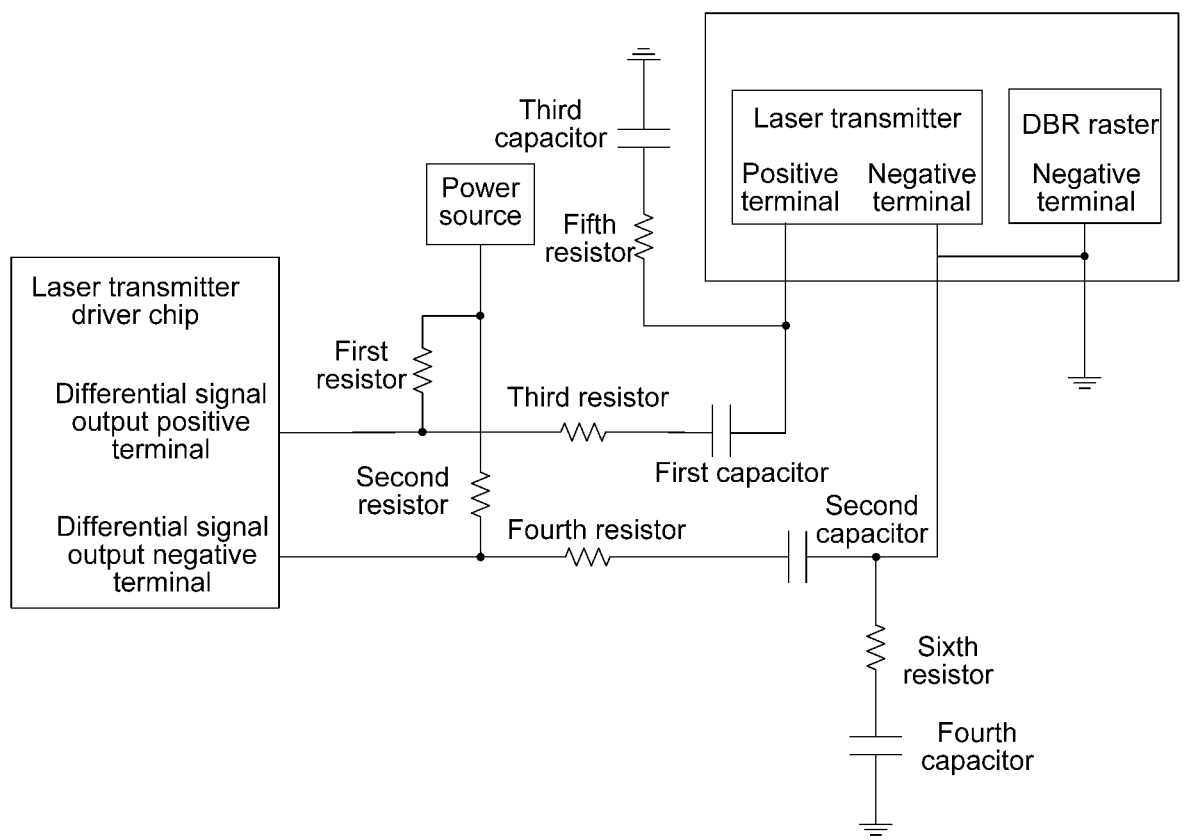
FIG. 4 is a schematic diagram of an optical module according to some embodiments of the present disclosure.

FIG. 4 is a schematic diagram of an optical module according to some embodiments of the present disclosure. As shown in FIG. 4, based on above embodiment, in order to smoothening signal or voltage, the optical module provided by the present embodiment may further include a filter circuit to filter out unwanted frequencies and meanwhile keep wanted frequencies.

The filter circuit may include a fifth resistor and a third capacitor, and/or a sixth resistor and a fourth capacitor. One end of the fifth resistor is connected with the positive terminal of the laser transmitter, the other end of the fifth resistor is connected with one end of the third capacitor, and the other end of the third capacitor is grounded; one end of the sixth resistor is connected with the negative terminal of the laser transmitter, the other end of the sixth resistor is connected with one end of the fourth capacitor, and the other end of the fourth capacitor is grounded.

In an implementation, the present embodiment may only include an RC filter circuit including the fifth resistor and the third capacitor, or may only include an RC filter circuit including the sixth resistor and the fourth capacitor; or includes the RC filter circuit including the fifth resistor and the third capacitor and the RC filter circuit including the sixth resistor and the fourth capacitor. It should be noted that in the present embodiment, resistance value ranges of the fifth resistor and the sixth resistor are 10-150 ohm, and capacitance ranges of the third capacitor and the fourth capacitor are 20-300 pf, which are not limited in the present embodiment.

According to the optical module in the present embodiment, the modulating circuit includes the first resistor and the first capacitor as well as the second resistor and the second capacitor, the third resistor is arranged between the first capacitor and the differential signal output positive terminal, and/or the fourth resistor is arranged between the second capacitor and the differential signal output negative terminal, and in order to smoothen signal or voltage in the circuit, an RC filter circuit including the fifth resistor and the third capacitor and/or an RC filter circuit including the sixth resistor and the fourth capacitor are/is further arranged. When the differential signal output positive terminal of the laser transmitter driver chip of the optical module is low-level and the differential signal output negative terminal is high-level, the first capacitor is charged, the second capacitor is discharged, and the laser transmitter emits weak light; when the differential signal output positive terminal is high-level, and the differential signal output negative terminal is low-level, the first capacitor is discharged, the second capacitor is charged, and the laser transmitter emits strong light, the modulating on the light emitting intensity of the laser transmitter is realized, by the third resistor and/or the fourth resistor, the low frequency noise signal is isolated, and by the RC filter circuit, the signal or voltage in the modulating circuit is smoothened.

Finally, it should be indicated that above respective embodiments merely intend to describe rather than limit the technical solutions of the present disclosure; although the disclosure is described in detail in reference to the respective embodiments, those common killed in the art should understand that the technical solutions cited in the respective embodiments may still be amended, or part or all of the technical characteristics therein may be equivalently substituted; and those amendments or substitutions do not depart the essence of corresponding technical solutions from the scope of the technical solutions of respective embodiments of the disclosure.

The invention claimed is:
1. An optical module, comprising:
    a laser transmitter driver chip comprising a differential signal output positive terminal and a differential signal output negative terminal;
    a laser transmitter comprising a positive terminal and a negative terminal;

a first capacitor electrically connecting the differential signal output positive terminal and the positive terminal of the laser transmitter;
a power source; and
a Distributed Bragg reflection (DBR) raster comprising a negative terminal.

2. The optical module according to claim 1, wherein:
the negative terminal of the laser transmitter is grounded.

3. The optical module according to claim 1, further comprising:
the negative terminal of the DBR raster electrically connecting to the negative terminal of the laser transmitter.

4. The optical module according to claim 1, wherein:
the negative terminal of the DBR raster is grounded.

5. The optical module according to claim 1, further comprising:
a first resistor electrically connecting the power source and the differential signal output positive terminal; and
a second resistor electrically connecting the power source and the differential signal output negative terminal.

6. The optical module according to claim 1, further comprising:
a resistor electrically connecting the first capacitor and the differential signal output positive terminal.

7. The optical module according to claim 1, further comprising:
a second capacitor comprising a first terminal and a second terminal, the first terminal of the second capacitor electrically connecting the differential signal output negative terminal, and the second terminal of the second capacitor is grounded.

8. The optical module according to claim 7, further comprising:
a resistor electrically connecting the second capacitor and the differential signal output negative terminal.

9. The optical module according to claim 1, wherein a second capacitor electrically connecting the differential signal output negative terminal and the negative terminal of the laser transmitter.

10. The optical module according to claim 1, further comprising:
a second capacitor electrically connecting a ground and a resistor; and
the resistor electrically connecting the second capacitor and the positive terminal of the laser transmitter.

11. The optical module according to claim 1, further comprising:
a second capacitor electrically connecting a ground and a resistor; and
the resistor electrically connecting the second capacitor and the negative terminal of the laser transmitter.

12. An optical module, comprising:
a laser transmitter driver chip comprising a first differential signal output terminal and a second differential signal output terminal;
a laser transmitter comprising a positive terminal and a negative terminal;
a first capacitor electrically connecting the first differential signal output terminal and the positive terminal of the laser transmitter;
a power source; and
a Distributed Bragg reflection (DBR) raster comprising a negative terminal.

13. The optical module according to claim 12, further comprising:
a second capacitor comprising a first terminal and a second terminal, the first terminal of the second capacitor electrically connecting the second differential signal output terminal, and the second terminal of the second capacitor is grounded.

14. The optical module according to claim 12, further comprising:
a first resistor electrically connecting the power source and the first differential signal output terminal; and
a second resistor electrically connecting the power source and the second differential signal output terminal.

15. The optical module according to claim 12, wherein the negative terminal of the DBR raster electrically connects to the negative terminal of the laser transmitter.

16. The optical module according to claim 12, wherein the negative terminal of the DBR raster is grounded.

17. An optical module, comprising:
a laser transmitter driver chip comprising a differential signal output positive terminal and a differential signal output negative terminal;
a laser transmitter comprising a positive terminal and a negative terminal;
a first capacitor electrically connecting a third resistor and the positive terminal of the laser transmitter, and the third resistor electrically connecting the first capacitor and the differential signal output positive terminal;
a second capacitor electrically connecting a fourth resistor and the negative terminal of the laser transmitter, and the fourth resistor electrically connecting the second capacitor and the differential signal output negative terminal;
a power source;
a first resistor electrically connecting the power source and the differential signal output positive terminal;
a second resistor electrically connecting the power source and the differential signal output negative terminal; and
a third capacitor electrically connecting a ground and a fifth resistor, and the fifth resistor electrically connecting the third capacitor and the positive terminal of the laser transmitter.

18. The optical module according to claim 17, further comprising:
a Distributed Bragg reflection (DBR) raster comprising a negative terminal, and the negative terminal of the DBR raster electrically connecting to the negative terminal of the laser transmitter.

19. The optical module according to claim 18, further comprising:
the negative terminal of the DBR raster and the negative terminal of the laser transmitter are grounded.

20. The optical module according to claim 17, further comprising:
a fourth capacitor electrically connecting a ground and a sixth resistor, and the sixth resistor electrically connecting the fourth capacitor and the negative terminal of the laser transmitter.

* * * * *